(12) United States Patent
Schrom et al.

(10) Patent No.: US 8,134,548 B2
(45) Date of Patent: Mar. 13, 2012

(54) DC-DC CONVERTER SWITCHING TRANSISTOR CURRENT MEASUREMENT TECHNIQUE

(75) Inventors: Gerhard Schrom, Hillsboro, OR (US); Peter Hazucha, Beaverton, OR (US); Vivek De, Beaverton, OR (US); Tanay Karnik, Portland, OR (US)

(73) Assignee: Micron Technology, Inc., Boise, ID (US)

( * ) Notice: Subject to any disclaimer, the term of this patent is extended or adjusted under 35 U.S.C. 154(b) by 1736 days.

(21) Appl. No.: 11/173,760

(22) Filed: Jun. 30, 2005

(65) Prior Publication Data

US 2007/0001762 A1 Jan. 4, 2007

(51) Int. Cl.
G09G 5/00 (2006.01)
H03F 3/45 (2006.01)
H01L 29/66 (2006.01)

(52) U.S. Cl. .......................... 345/211; 257/159; 330/253
(58) Field of Classification Search .................... 345/39, 345/42, 44, 52, 82, 84, 204, 690, 211, 904; 257/159, 160, 266, 271, 287, 401; 330/253, 330/397
See application file for complete search history.

(56) References Cited

U.S. PATENT DOCUMENTS

| | | | |
|---|---|---|---|
| 3,607,462 A | 9/1971 | Laing | |
| 3,881,244 A | 5/1975 | Kendall | |
| 3,905,883 A | 9/1975 | Hanazono et al. | |
| 4,055,774 A * | 10/1977 | Ahmed | 327/538 |
| 4,543,553 A | 9/1985 | Mandai et al. | |
| 4,791,719 A | 12/1988 | Kobayashi et al. | |
| 4,797,648 A | 1/1989 | Kaneko et al. | |
| 4,816,784 A | 3/1989 | Rabjohn | |
| 4,884,156 A | 11/1989 | Miyakawa et al. | |
| 4,959,631 A | 9/1990 | Hasegawa et al. | |
| 5,047,296 A | 9/1991 | Miltenberger et al. | |
| 5,053,697 A | 10/1991 | Carnel et al. | |
| 5,095,357 A | 3/1992 | Andoh et al. | |
| 5,121,852 A | 6/1992 | Wilkes | |
| 5,169,713 A | 12/1992 | Kumurdjian | |
| 5,221,459 A | 6/1993 | Okano et al. | |
| 5,298,857 A | 3/1994 | Voisine et al. | |
| 5,420,558 A | 5/1995 | Ito et al. | |
| 5,446,311 A | 8/1995 | Ewen et al. | |
| 5,469,399 A | 11/1995 | Sato et al. | |
| 5,530,415 A | 6/1996 | Takaya | |
| 5,583,474 A | 12/1996 | Mizoguchi et al. | |

(Continued)

FOREIGN PATENT DOCUMENTS

DE 4117878 12/1991

(Continued)

OTHER PUBLICATIONS

"U.S. Appl. No. 10/977,145 Non Final Office Action mailed Mar. 27, 2006", 8 pgs.

(Continued)

*Primary Examiner* — Kevin M Nguyen
(74) *Attorney, Agent, or Firm* — Schwegman, Lundberg & Woessner, P.A.

(57) ABSTRACT

A method is described comprising conducting a first current through a switching transistor. The method also comprises conducting a second current through a pair of transistors whose conductive channels are coupled in series with respect to each other and are together coupled in parallel across the switching transistor's conductive channel. The second current is less than and proportional to the first current.

16 Claims, 4 Drawing Sheets

U.S. PATENT DOCUMENTS

| | | | |
|---|---|---|---|
| 5,609,946 A | 3/1997 | Korman et al. |
| 5,635,892 A | 6/1997 | Ashby et al. |
| 5,694,030 A | 12/1997 | Sato et al. |
| 5,696,441 A | 12/1997 | Mak et al. |
| 5,705,287 A | 1/1998 | Doerner et al. |
| 5,781,071 A | 7/1998 | Kusunoki |
| 5,801,100 A | 9/1998 | Lee et al. |
| 5,834,825 A | 11/1998 | Imai |
| 5,877,533 A | 3/1999 | Arai et al. |
| 5,892,425 A | 4/1999 | Kuhn et al. |
| 5,920,979 A | 7/1999 | Nepela et al. |
| 5,930,415 A | 7/1999 | Pham |
| 5,952,704 A | 9/1999 | Yu et al. |
| 5,961,746 A | 10/1999 | Nepela |
| 5,976,715 A | 11/1999 | Chen et al. |
| 6,031,445 A | 2/2000 | Marty et al. |
| 6,033,782 A | 3/2000 | Hubbard et al. |
| 6,037,649 A | 3/2000 | Liou |
| 6,040,226 A | 3/2000 | Wojnarowski et al. |
| 6,043,641 A | 3/2000 | Singer et al. |
| 6,067,002 A | 5/2000 | Fujino et al. |
| 6,103,136 A | 8/2000 | Han et al. |
| 6,114,937 A | 9/2000 | Burghartz et al. |
| 6,121,852 A | 9/2000 | Mizoguchi et al. |
| 6,166,422 A | 12/2000 | Qian et al. |
| 6,191,495 B1 | 2/2001 | Kossives et al. |
| 6,194,987 B1 | 2/2001 | Zhou et al. |
| 6,201,287 B1 | 3/2001 | Forbes |
| 6,207,303 B1 | 3/2001 | Tomita |
| 6,240,621 B1 | 6/2001 | Nellissen et al. |
| 6,281,560 B1 | 8/2001 | Allen et al. |
| 6,291,305 B1 | 9/2001 | Huang et al. |
| 6,392,524 B1 | 5/2002 | Biegelsen et al. |
| 6,404,317 B1 | 6/2002 | Mizoguchi et al. |
| 6,433,299 B1 | 8/2002 | Varshney |
| 6,441,715 B1 | 8/2002 | Johnson |
| 6,452,247 B1 | 9/2002 | Gardner |
| 6,593,841 B1 | 7/2003 | Mizoguchi et al. |
| 6,838,863 B2 | 1/2005 | Hazucha et al. |
| 6,856,228 B2 | 2/2005 | Gardner |
| 6,870,456 B2 | 3/2005 | Gardner |
| 6,891,461 B2 | 5/2005 | Gardner |
| 7,208,963 B2 | 4/2007 | Schrom et al. |
| 2001/0052837 A1 | 12/2001 | Walsh |
| 2003/0001709 A1 | 1/2003 | Visser |
| 2003/0001713 A1 | 1/2003 | Gardner |
| 2004/0246226 A1 | 12/2004 | Moon |
| 2006/0091896 A1 | 5/2006 | Schrom et al. |

FOREIGN PATENT DOCUMENTS

| | | |
|---|---|---|
| EP | 0295028 A1 | 12/1988 |
| EP | 0725407 A1 | 8/1996 |
| EP | 0884783 A2 | 12/1998 |
| FR | 2369694 | 5/1978 |
| JP | 61020311 | 1/1986 |
| JP | 3214411 | 9/1991 |
| JP | 5081615 | 4/1993 |
| JP | 6124843 | 5/1994 |
| JP | 7272932 | 10/1995 |
| JP | 2000082621 | 3/2000 |
| TW | 378417 | 1/2000 |
| TW | 386310 | 4/2000 |
| TW | 411481 | 11/2000 |
| WO | WO-0139220 A1 | 5/2001 |
| WO | WO-02065492 A2 | 8/2002 |

OTHER PUBLICATIONS

"U.S. Appl. No. 10/430,508 Response filed Apr. 7, 2008 to Non Final Office Action mailed Jan. 7, 2008", 11 pgs.

"U.S. Appl. No. 10/430,508, Non-Final Office Action mailed Jan. 7, 2008", 9 pgs.

"U.S. Appl. No. 10/977,145 Notice of Allowance mailed Nov. 24, 2006", 7 pgs.

"U.S. Appl. No. 10/977,145 Response filed Sep. 27, 2006 to Non Final Office Action mailed Mar. 27, 2006", 11 pgs.

Baba, M., "GHz-Drive Magnetic Thin-Film Inductor Using CoNbZr Film", *Journal of the Magnetics Society of Japan*, 24(4-2), (2000),879-882.

Brandon, E., "Microinductors for Sacecraft Power Eectronics", *6th International Symposium, Magnetic Materials, Processes and Device VI Applications to Storage and Microelectromechanical systems (MEMS)*, vol. 2000-29, The Electrochemical Society, Inc., Pennington, New Jersey,(2001),559-567.

Fessant, A., et al., "Influence of In-Plane Anisotropy and Eddy Currents on the Frequency Spectra of the Complex Permeability of Amorphous CoZr Thin Films", *IEEE Transactions on Magnetics*, 29(1), (Jan. 1993),82-87.

Gardner, D., "Mechanical Stress as a Function of Temperature for Aluminum Alloy Films", *Journal of Applied Physics*, 67(4), (Feb. 15, 1990),1831-1845.

Kobayashi, Y, "New Type Micro Cloth-Inductor and Transformer With Thin Amorphous Wires and Multi-Thin Coils", *IEEE Transactions on Magnetics*, 28(5), (Sep. 1992),3012-3014.

Korenivski, V., "Magnetic Film Inductors for Radio Frequency Applications", *Journal of Applied Physics*, 82(10), (Nov. 15, 1997),5247-5254.

Long, J., "The Modeling, Characterization, and Design of Monolithic Inductors for Silicon RF IC's", *IEEE Journal of Solid-State Circuits*, 32(2), (Mar. 1997),357-369.

Matsuki, H., "A New Cloth Inductor Using Amorphous Fiber", *IEEE Transactions on Magnetics*, 21(5), (Sep. 1985),1738-1740.

Matsumoto, S., "Integration of a Power Supply for System-on-Chip", *IEICE Transactions on Fundamentals of Electronics, Communications and Computer Sciences*, vol. E80-A, No. 2, (Feb. 1997),276-282.

Mino, M., et al., "A New Planar Microtransformer for Use in Micro-Switching Converters", *IEEE Transactions on Magnetics*, 28(4),(Jul. 1992),1969-1973.

Mino, M., et al., "Planar Microtransformer With Monolithically-Integrated Rectifier Diodes for Micro-Switching Converters", *IEEE Transactions on Magnetics*, vol. 32(2), (Mar. 1996),291-296.

Mohan, S., "Bandwidth Extension in CMOS With Optimized On-Chip Inductors", *IEEE Journal of Solid-State Circuits*, 35(3), (Mar. 2000),346-355.

Mohan, S., "Simple Accurate Expressions for Planar Spiral Inductances", *IEEE Journal of Solid-State Circuits*, 34(10), (Oct. 1999),1419-1424.

Niknejad, A., "Analysis, Design, and Optimization of Spiral Inductors and Transformers Si RF IC's", *IEEE Journal of Solid-State Circuits*, 33(10), (Oct. 1998),1470-1481.

O'Donnell, T., "Microtransformers and Inductors using Permalloy Thin Films", *Preparation, Properties, and Applications of Thin Ferromagnetic Films*, http://www.iemw.tuwien.ac.at/publication/workshop0600/ODonnell.html,(Jun. 2000),45-52.

Oshiro, O., et al., "A Novel Miniature Planar Inductor", *IEEE Transactions on Magnetics*, vol. Mag-23, No. 5, (1987),3759-3761.

Park, J. Y., et al., "Batch-Fabricated Microinductors With Electroplated Magnetically Anisotropic and Laminated Alloy Cores", *IEEE Transactions on Magnetics*, 35(5), (Sep. 1999),4291-4300.

Sato, T., "New Applications to Nanocrystalline Fe(Co-Fe)Hf-O Magnetic Films to micromagnetic devices", *Journal of Applied Physics*, 83(11), (Jun. 1, 1998),6658-6660.

Shirakawa, K., "Thin Film Cloth-Structured Inductor for Magnetic Integrated Circuit", *IEEE Transactions on Magnetics*, 26(5), (Sep. 1990),2262-2264.

Tomita, H., "Oblique-field annealing effect for in-plane magnetic anisotropy of soft magnetic Co-Nb-Zr thin films", *IEEE Transactions on Magnetics*, 30(3), (May 1994),1336-1339.

Yabukami, S., "Noise Analysis of a MHz-3 GHz Magnetic Thin Film Permeance Meter", *Journal of Applied Physics*, 85(8), (Apr. 15, 1999),5148-5150.

Yamaguchi, M., "1 GH-z-drive magnetic thin-film inductors for RF integrated circuits using micro-patterned granular films", *Digest of INTERMAG 99, 1999 IEEE International Magnetics Conference, 1999*, (May 18-21, 1999),ED01-ED01.

Yamaguchi, M., "Chapter 5. Magnetic Films for Planar Inductive Components and Devices", *In: Handbook of Thin Film Devices*, vol. 4—*Magnetic Thin Film Devices*, Francombe, M. H., Editor,(2000),185-212.

Yamaguchi, M., "Characteristics of Magnetic Thin-Film Inductors at Large Magnetic Field", *IEEE Transactions on Magnetics*, 31(6), (Nov. 1995),4229-4231.

Yamaguchi, M., "Magnetic Thin-Film Inductor for RF Integrated Circuits", *Extended Abstracts of the 1999 International Conference on Solid-State Devices and Materials*, Tokyo, (1999),580-581.

Yamaguchi, M., "Microfabrication and Characteristics of Magnectic Thin-Film Inductors in the Ultra High Frequency Region", *Journal of Applied Physics*, 85(11), (Jun. 1, 1999),7919-7922.

Yue, C., "On-Chip Spiral Inductors With Patterned Ground Shields for Si-Based RF IC's", *IEEE Jorunal of Solid-State Circuits*, 33(5), (May 1998),743-752.

Zommer, N., et al., "Power current mirror devices and their applications" Proc. Power convers. Int. Conf. Jun. 1986, pp. 275-283.

Koniklijke PHILIPS Electronics, AN10322_1 Current Sensing Power MOSFETs Rev. 01.00-09 Sep. 9, 2004. Application note. 10 pgs.

\* cited by examiner though not specifically depicted in FIG. 2 or FIG. 3, those of ordinary skill will understand that a ground shield resistor (Rgnd_shield) is shown as a variable resistor is coupled between the source of Q1 and the positive terminal of the amplifier.

DC-DC CONVERTER SWITCHING TRANSISTOR CURRENT MEASUREMENT TECHNIQUE

BACKGROUND

DC-DC converters typically craft a DC voltage by full wave rectifying and filtering one or more time varying signals. Because of the switching undertaken in the full wave rectification process, significant amounts of current are frequently "switched" back-and-forth at rapid pace by large transistors. It is often helpful to measure the current through these transistors to, for instance, determine whether or not the DC-DC converter is being loaded, monitor any ripple currents resulting from rectification, etc.

Two "straight-forward" techniques are readily known in the art for measuring current: 1) shunt inductance; and, 2) series resistance. Shunt inductance induces a current measurement signal in an inductor by coupling magnetic fields that are produced by the current signal being measured through the inductor. Unfortunately, shunt inductance is not practical for rapidly changing currents because the bandwidth of an inductor is limited (i.e., the inductor will increasingly attenuate the current measurement signal as its frequency increases).

The series resistance technique, which is shown in FIG. 1, does not typically suffer from limited bandwidth issues because a pure resistance does not change its resistive properties as a function of signal frequency. Unfortunately, however, the series resistance technique is also not practical for large currents (such as those drawn by a DC-DC converter's switching transistors) because a large current being driven through a resistance will tend to dissipate large amounts of power (through the relationship $P=I^2R$) which may result in overheating; or, if the power "problem" is handled by using a very small series resistance, inaccuracy results because the signal $V=I*R$ may become too small to measure.

FIGURES

The present invention is illustrated by way of example and not limitation in the figures of the accompanying drawings, in which like references indicate similar elements and in which.

DETAILED DESCRIPTION

Figure 1:
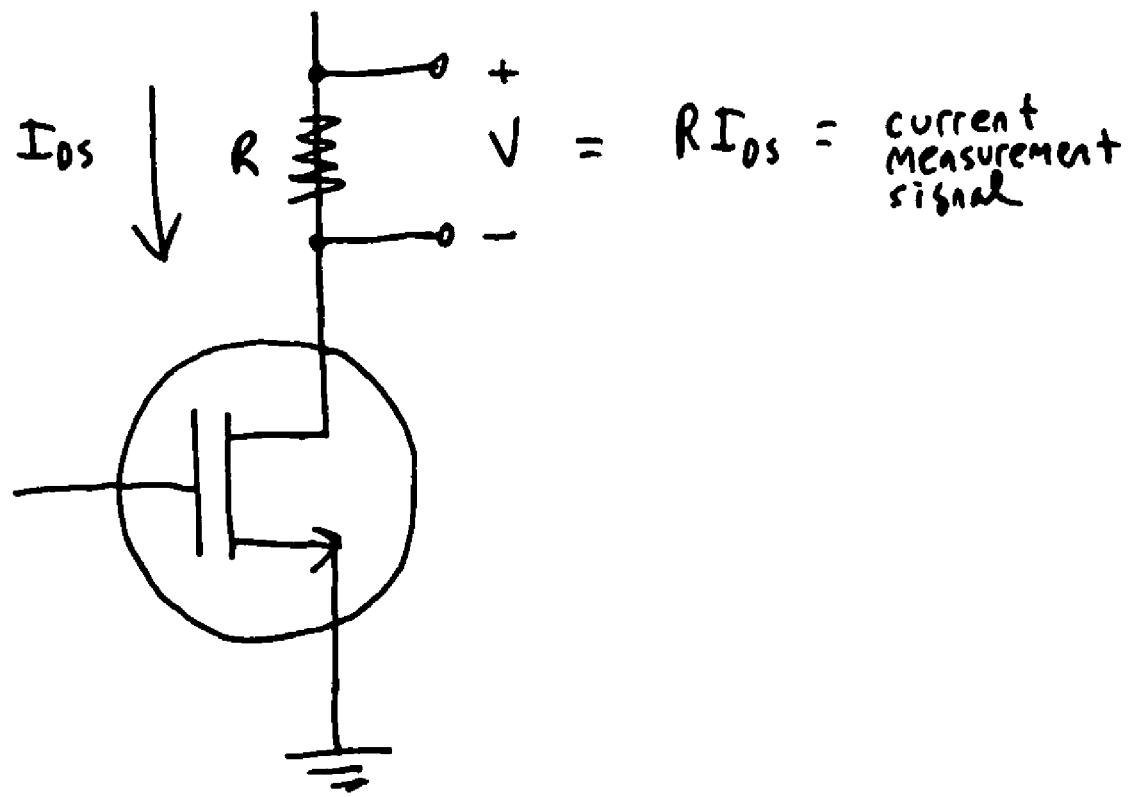
FIG. 1 shows resistance couples in series with a DC-DC converter switching transistor.
Figure 2:
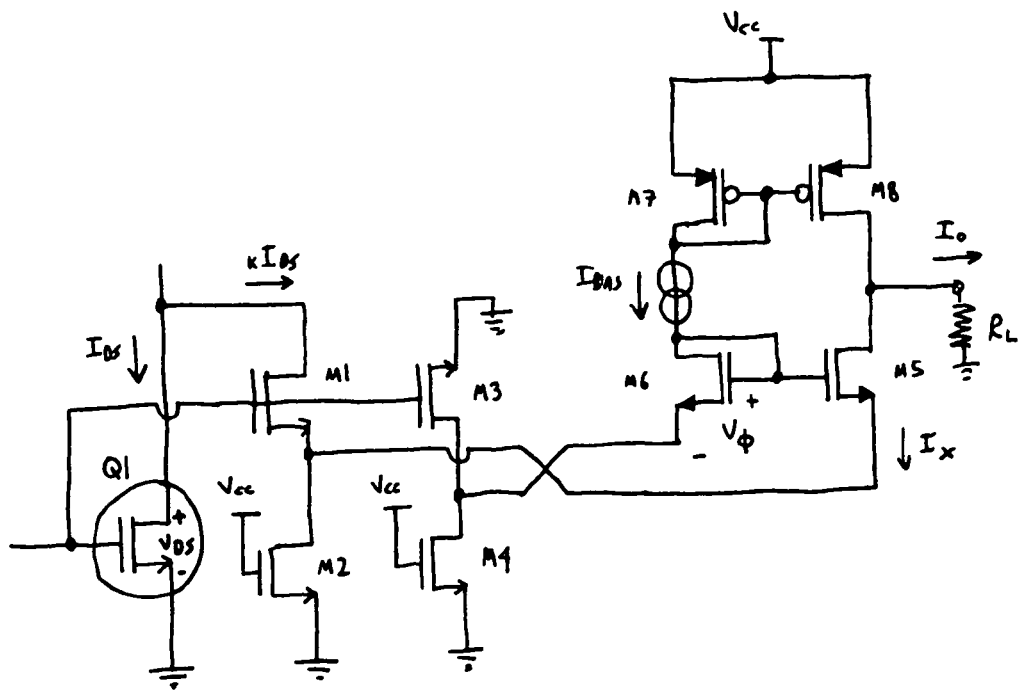
FIG. 2 shows an embodiment of a current measurement circuit coupled to a DC-DC converter switching transistor.

FIG. 2 shows a circuit directed to measuring the $I_{DS}$ current of transistor Q1 without the use of a series resistance through which the $I_{DS}$ current flows. Here, transistor Q1 may be a large switching transistor whose drain-to-source current ($I_{DS}$) is rapidly changing with large amplitude. A pair of transistors M1, M2 having their conductive channels coupled in series (where, the conductive channel of a transistor is understood to be the channel between its drain and source nodes). The drain of M1 is coupled to the drain of the switching transistor's conductive channel. The source of M2 is coupled to the source of the switching transistor's conductive channel (through the ground node). A node between the M1 and M2 transistors is coupled to an input of an amplifier (the source node of M5). A second pair of transistors M3 and M4 have their conductive channels coupled in parallel (their drains are tied together and their source nodes are tied to ground) and a node between the second pair of transistors M3, M4 is coupled to a reference input of the amplifier (the source node of M6).

According to the theory of operation of the circuitry of FIG. 2, a current flow of approximately $kI_{DS}$ will flow through transistor M1, where k<1 (e.g., in many applications k is expected to be within a range of 0.0001 to 0.01 inclusive). The $kI_{DS}$ current flow through transistor M1 influences an output signal Io which can be used as an indicator of the current $I_{DS}$ through transistor Q1. In a typical implementation transistors M1 and M2, as well as M3 and M4 are scaled down versions of transistor Q1 (e.g., being designed with identical doping profiles and gate lengths but with different gate widths). Since a large transistor Q1 is often implemented as a parallel connection of many identical small transistors (legs), the smaller transistors M1, M2, M3, and M4 can be implemented using just a few of the same small transistors.

The proportionality factor can be approximately computed from the transistors' widths as $1/k=W_{Q1}*(1/W_{M1}+1/W_{M2})$. In some applications a value of k>1 may be desirable. The M1 and M2 structure essentially enables fast and accurate measurement of the $I_{DS}$ current without actually imposing a series resistance through the $I_{DS}$ current path. To ensure proper operation, M1 and M3 may be matched and M2 and M4 may be matched respectively. To improve the accuracy at larger drain-to-source voltages $V_{DS}$ in Q1, especially, when Q1 is operating in saturation, M1 may be chosen to be smaller than M2. To enhance the output signal Io, M1 may be chosen to be larger than M2.

Transistors M5, M6, M7 and M8 form a common gate amplifier having: 1) a reference leg M6, M7 whose current, $I_{BIAS}$, flows into the resistive network formed by transistors M3 and M4; and, 2) a measurement leg M5, M8 whose current $I_X$ flows into the resistive network formed by transistors M1 and M2.

The principle of operation of the entire circuit is that voltage changes in proportion to $kI_{DS}$ at the source of transistor M5 causes the gate-to-source voltage of transistor M5 to differ with respect to that of transistor M6 such that an output current Io is created having a component that varies in proportion to $kI_{DS}$. The current $I_{BIAS}$ may be injected using various techniques, such as, e.g., using a reference current circuit or a resistor connected to the gates of M6 and M7.

Figure 3:
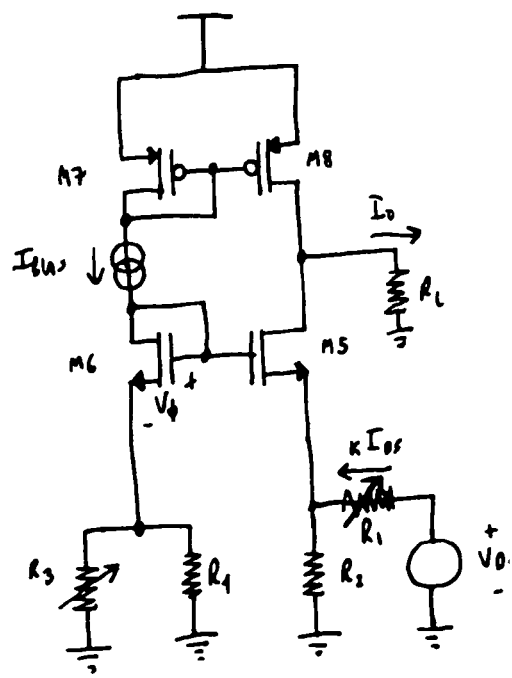
FIG. 3 shows an equivalent circuit for the circuit of FIG. 2.

The principle of operation of the circuit of FIG. 2 is more easily viewed with the equivalent circuit of FIG. 3. Comparing FIGS. 2 and 3, note that: 1) transistor M1 has been replaced by a variable resistance R1 and a voltage source $V_{DS}$ causing a current of $kI_{DS}$; 2) transistor M2 has been replaced by resistance R2; 3) transistor M3 has been replaced by variable resistance R3; and, 4) transistor M4 has been replaced by resistance R4.

Transistors M2 and M4 are designed to be in the linear mode over the range of operation for the circuit. Therefore, M2 and M4 will behave like resistors (i.e., approximately a linear relationship between its drain-to-source voltage and its drain-to-source current). Moreover, like M2 and M4, transistors M1 and M3 are also ideally designed to remain in linear mode of operation, when transistor Q1 is in linear mode, and to be in saturation mode when Q1 is in saturation mode. In order to help effect this behavior, the gates of transistors M2 and M4 are tied to a fixed voltage ($V_{CC}$) and the gates of transistors M1 and M3 are tied to the gate of transistor Q1.

With transistors M5 and M6 in saturation mode, and with transistors M7 and M8 forming a current mirror, it can be shown that the output current Io for the circuit of FIG. 3 can be approximated as:

$$Io \approx kI_{DS}(R1//(R1R//2+R5))+(((R1//R2)-(R1//R4))/(R1//R2+R5))I_{BIAS} \quad \text{Eqn. 1}$$

where $I_{DS}$ is the current being measured (i.e., the drain-to-source current of transistor Q1), k is a proportionality constant between the drain-to-source currents of transistors Q1 and M1, and R5 is the common-gate input resistance of transistor M5. Moreover, $$R3//R4=(R3R4)/(R3+R4) \quad \text{Eqn. 2a}$$

$$R1//R2=(R1R2)/(R1+R2) \quad \text{Eqn. 2b}$$

which corresponds to the effective resistances of resistors R3 and R4 in parallel and R1 and R2 in parallel, respectively. Since R1=R3 and R2=R4, $I_{BIAS}$ does not add to the output signal Io. The value of R5 depends on the transconductance parameter β of M5 and on the bias current $I_{BIAS}$:

$$R5=1/\text{sqrt}(2\mu_{M5}(I_{BIAS}-Io)) \quad \text{Eqn. 3}$$

In a typical design R5 may be large compared to R1//R2, e.g., ten times larger, to reduce the power consumption of the common-gate amplifier. In other designs R5 may be comparable to or even smaller than R1//R2 in order to improve linearity. To ensure proper operation the bias current should be larger than the maximum output current: $I_{BIAS}$>Io. For negative currents Io<0 the bias current may be reduced to a very small value, e.g., by operating M5 and M6 at or slightly above threshold. The presence of M3 also provides for good suppression of noise from the gate node of transistor Q1 since the noise injected through the gate capacitances of M1 and M3 approximately cancels out. Note that although the reference voltage of FIGS. 2 and 3 correspond to a ground node, another fixed voltage could be used (such as a supply node) provided appropriate offset were applied to $V_{CC}$.

Other Circuits

Figure 4:
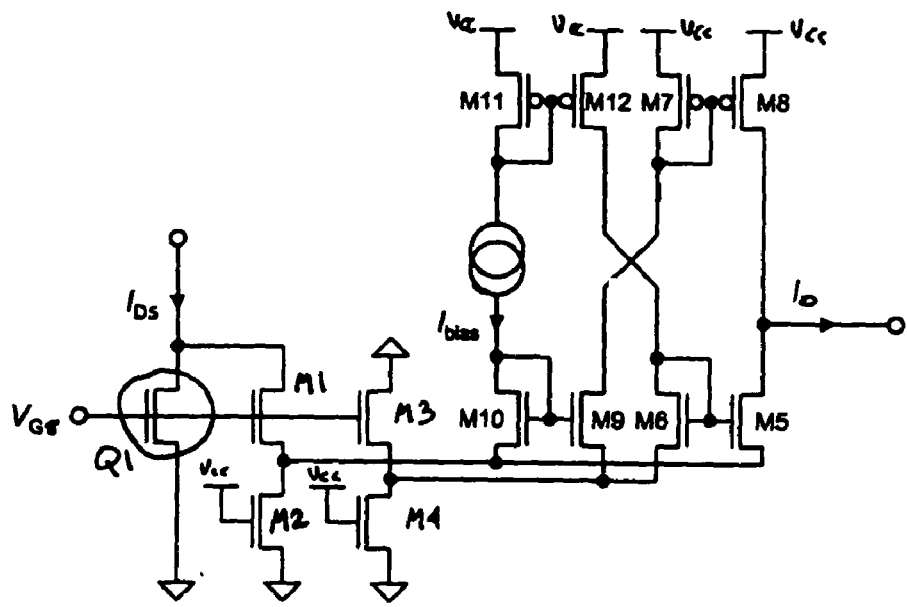
FIG. 4 shows another circuit that measures DC-DC converter switching transistor current using a similar M1 through M4 structure as shown in FIG. 2.

FIG. 4 provides another circuit design that uses the M1 through M4 structure as a device for measuring $I_{DS}$, but uses a different common-gate amplifier, formed by M5 through M11, to generate the output signal Io. This amplifier is essentially equivalent to a combination of two replicas of the amplifier M5 through M8 in FIG. 2 and provides improved range and linearity at a reduced bias current.

When the current $I_{DS}$ of Q1 is small, i.e., the output signal is approximately $-I_{BIAS}$<Io<+$I_{BIAS}$ both parts of the amplifier, M5 through M8 and M9 through M11 respectively, contribute to the output signal Io. When current is large and positive, i.e., Io>+$I_{BIAS}$, M9 through M11 will increase their contribution to Io due to the nonlinearity of the circuit, whereas M5 through M8 will reduce and eventually cease their contribution to the output signal.

Furthermore, when the current is large and negative, i.e., Io<-$I_{BIAS}$, M9 through M11 will reduce their contribution to Io and M5 through M8 will take over. Thus, the non-linearities of both halves of the amplifier compensate each other, resulting in improved linearity and range at a smaller bias current. The method for properly chosing the bias current $I_{BIAS}$ and the sizes of M5 through M11 usually involves simple calculations and circuit simulations, which anyone skilled in the art can easily carry out.

Figure 5:
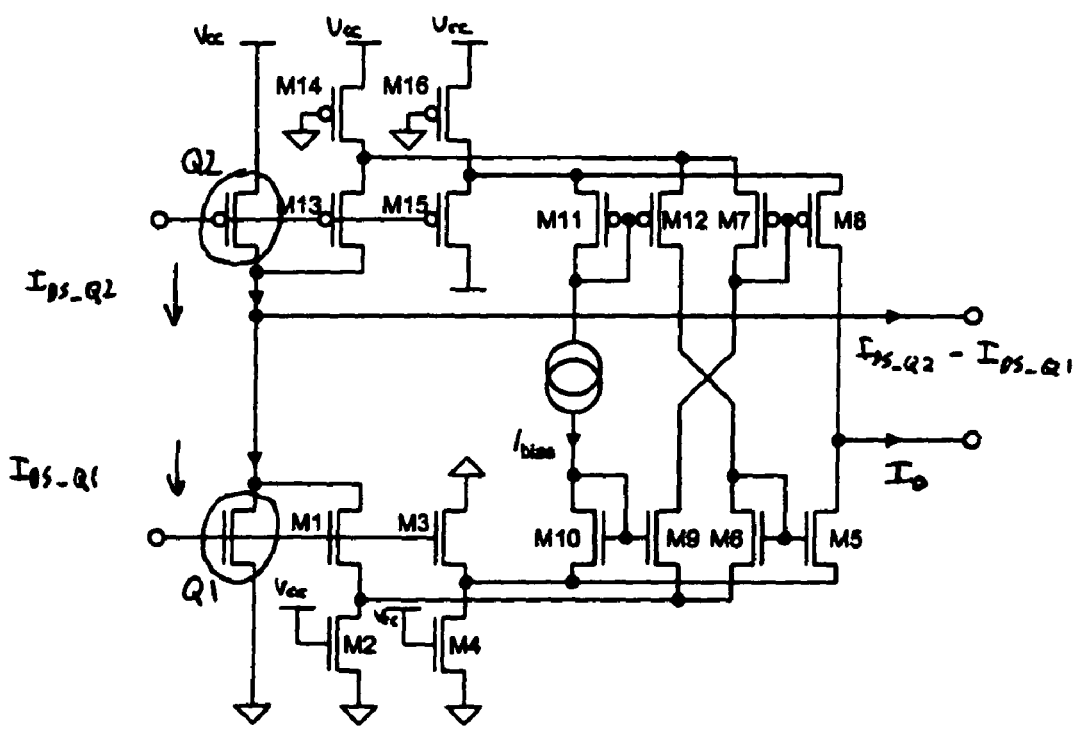
FIG. 5 shows an extension of the circuit of FIG. 4 capable of providing an indication of the output current from the pair of switching transistors Q1 and Q2.

FIG. 5 shows a circuit that measures the current through both of switching transistors Q1 and Q2. M13 through M16 are the PMOS equivalent of M1 through M4 respectively, and, M7, M8, M11, M12 are coupled so that they become the PMOS equivalent of M5, M6, M10 and M9 respectively. Arrangement in this manner allows for an output Io that varies with $I_{DS\_Q2}$-$I_{DS\_Q1}$.

Possible Applications of Current Measurement Circuits

It is envisioned that embodiments of the current measurement approaches described herein can be used in "on-chip" DC-DC converters. A DC-DC converter is a device that converts a first fixed voltage into a second fixed voltage. Here, for example, transistor Q1 (and transistors Q1 and Q2 in FIG. 4) can be a large switching transistor in an "on-chip" DC-DC converter (and transistors Q1 and Q2 can be large switching transistors in an "on-chip" DC-DC converter).

The current measurement circuit can be used for various functions such as, to name a few: 1) soft—switching, i.e., to monitor the currents through switching transistors in order to determine the proper time for turn-off; 2) monitoring the ripple current in DC-DC converters; 3) "safe turn off" in "on-chip" DC-DC converters (e.g., turning off the DC-DC converter when the inductor currents flowing through the switching transistors are small enough to prevent voltage overshoot); and, 4) monitoring the load current, e.g., in "on-chip" DC-DC converters used to a CPU (central processing unit) or part of a CPU.

Figure 6:
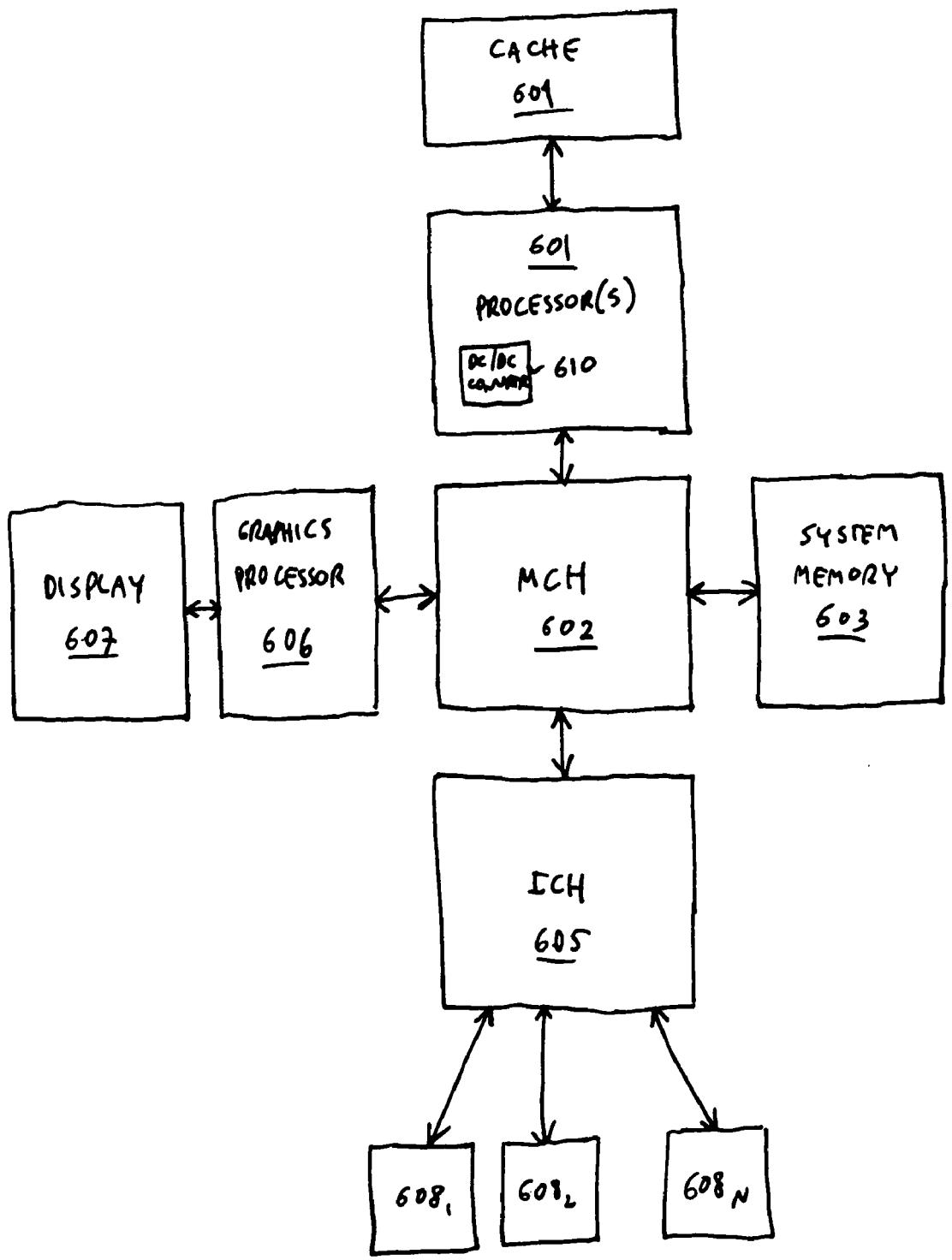
FIG. 6 shows a computing system whose processor(s) include a DC-DC converter.

FIG. 7 shows an embodiment of a computing system. The exemplary computing system of FIG. 6 includes: 1) one or more processors 601 having an "on-chip" DC-DC converter 610; 2) a memory control hub (MCH) 602; 3) a system memory 603 (of which different types exist such as DDR RAM, EDO RAM, etc,); 4) a cache 604; 5) an I/O control hub (ICH) 605; 6) a graphics processor 606; 6) a display/screen 607 (of which different types exist such as Cathode Ray Tube (CRT), Thin Film Transistor (TFT), Liquid Crystal Display (LCD), DPL, etc.; 8) one or more I/O devices 608.

The one or more processors 601 execute instructions in order to perform whatever software routines the computing system implements. The instructions frequently involve some sort of operation performed upon data. Both data and instructions are stored in system memory 603 and cache 604. Cache 604 is typically designed to have shorter latency times than system memory 603. For example, cache 604 might be integrated onto the same silicon chip(s) as the processor(s) and/or constructed with faster SRAM cells whilst system memory 603 might be constructed with slower DRAM cells.

By tending to store more frequently used instructions and data in the cache 604 as opposed to the system memory 603, the overall performance efficiency of the computing system improves. System memory 603 is deliberately made available to other components within the computing system. For example, the data received from various interfaces to the computing system (e.g., keyboard and mouse, printer port, LAN port, modem port, etc.) or retrieved from an internal storage element of the computing system (e.g., hard disk drive) are often temporarily queued into system memory 603 prior to their being operated upon by the one or more processor(s) 601 in the implementation of a software program.

Similarly, data that a software program determines should be sent from the computing system to an outside entity through one of the computing system interfaces, or stored into an internal storage element, is often temporarily queued in system memory 603 prior to its being transmitted or stored.

The ICH 605 is responsible for ensuring that such data is properly passed between the system memory 603 and its appropriate corresponding computing system interface (and internal storage device if the computing system is so designed). The MCH 602 is responsible for managing the various contending requests for system memory 603 access amongst the processor(s) 601, interfaces and internal storage elements that may proximately arise in time with respect to one another.

One or more I/O devices 608 are also implemented in a typical computing system. I/O devices generally are responsible for transferring data to and/or from the computing system (e.g., a networking adapter); or, for large scale non-volatile storage within the computing system (e.g., hard disk drive). ICH 605 has bi-directional point-to-point links between itself and the observed I/O devices 608.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

The invention claimed is:

1. An apparatus, comprising:
   a) a switching transistor;
   b) a pair of transistors having their conductive channels coupled in series, a drain of one of said pair of transistors coupled to one end of said switching transistor's conductive channel, a source of the other of said pair of transistors coupled to the other end of said switching transistor's conductive channel, and a source of the one of said pair of transistors coupled in series to a drain of the other of said pair of transistors; and,
   c) a node between said pair of transistors coupled to an input of an amplifier; and
   d) a second pair of transistors having their conductive channels coupled in parallel, a node between said second pair of transistors coupled to a reference input of said amplifier, wherein a transistor of said first pair of transistors is designed to be matched to a transistor of said second pair of transistors.

2. The apparatus of claim 1 wherein a transistor from said first pair of transistors and a transistor from said second pair of transistors each have their gates coupled to said switching transistor's gate, and wherein, a second transistor from said first pair of transistors and a second transistor from said second pair of transistors each have their gates coupled to a fixed voltage node.

3. The apparatus of claim 1 wherein a transistor from said first pair of transistors and a first transistor from said second pair of transistors were designed to impose the same resistance, said resistance greater than the resistance posed by the second transistor of said second pair of transistors.

4. The apparatus of claim 1 wherein said amplifier is a common gate amplifier.

5. The apparatus of claim 1 wherein a node at which one of said pair of transistors is coupled to said switching transistor's conductive channel is a fixed voltage node.

6. The apparatus of claim 5 wherein said fixed voltage node is a reference node.

7. The apparatus of claim 5 wherein said fixed voltage node is a supply node.

8. The apparatus of claim 1 wherein a first of said pair of transistors is to provide to a second of said pair of transistors a current that is proportional to the current within said switching transistor's conductive channel.

9. The apparatus of claim 8 wherein said input of said amplifier is a measurement leg designed to bias said first of said pair of transistors in a linear mode of operation.

10. The apparatus of claim 9 further comprising a second pair of transistors having their conductive channels coupled in parallel, a node between said second pair of transistors coupled to a reference leg of said amplifier.

11. The apparatus of claim 10 further comprising one of said second pair of transistors having one end of its conductive channel coupled to a fixed voltage node at which one of said pair of transistors is said coupled to an end of said switching transistor's conductive channel.

12. A method, comprising:
    conducting a first current through a switching transistor;
    conducting a second current through a pair of transistors whose conductive channels are coupled in series with respect to each other such that said pair of transistors pass said second current through said conductive channels and are together coupled in parallel across said switching transistor's conductive channel, said second current less than and proportional to said first current; and,
    conducting a third current from a reference node of an amplifier to a node between a second pair of transistors that are coupled in parallel, a transistor of said first pair of transistors designed to be matched to a transistor of said second pair of transistors.

13. The method of claim 12 further comprising:
    setting a gate-to-source voltage of a transistor with a voltage appearing at a node between said pair of transistors.

14. The method of claim 13 further comprising:
    generating a fourth current that is proportional to said first current in response to said setting.

15. The method of claim 14 wherein said setting further comprises raising said transistor's source voltage with said voltage and lowering said transistor's gate voltage with a second voltage, said second voltage appearing between said second pair of transistors, one of said second pair of transistors having its gate voltage vary with said switching transistor's gate voltage.

16. The method of claim 15 wherein both of said second pair of transistors are operating in a linear region of operation and at least one of said fist pair of transistors are operating in a linear region of operation.

* * * * *

UNITED STATES PATENT AND TRADEMARK OFFICE
CERTIFICATE OF CORRECTION

| | | |
|---|---|---|
| PATENT NO. | : 8,134,548 B2 | Page 1 of 1 |
| APPLICATION NO. | : 11/173760 | |
| DATED | : March 13, 2012 | |
| INVENTOR(S) | : Gerhard Schrom et al. | |

It is certified that error appears in the above-identified patent and that said Letters Patent is hereby corrected as shown below:

In column 6, line 54, in Claim 16, delete "fist" and insert -- first --, therefor.

Signed and Sealed this
Eighth Day of May, 2012

David J. Kappos
*Director of the United States Patent and Trademark Office*